United States Patent [19]
Saxe et al.

[11] Patent Number: 4,789,950
[45] Date of Patent: Dec. 6, 1988

[54] PRE-INTERPOLATION ADAPTIVE FILTER

[75] Inventors: Charles L. Saxe; Daniel E. Milliron, both of Beaverton, Oreg.

[73] Assignee: Tektronix, Inc., Beaverton, Oreg.

[21] Appl. No.: 907,282

[22] Filed: Sep. 11, 1986

[51] Int. Cl.$^4$ ..................... G06F 15/20; G01R 29/02
[52] U.S. Cl. .................... 364/577; 307/263; 307/517; 324/78 F; 324/102; 364/481; 364/486
[58] Field of Search ................ 364/481–483, 364/486, 487, 577; 324/78 F, 102; 307/260, 263, 517

[56] References Cited

U.S. PATENT DOCUMENTS

| | | | |
|---|---|---|---|
| 4,068,165 | 1/1978 | Labinsky et al. | 364/487 |
| 4,495,642 | 1/1985 | Zellmer | 324/121 R |
| 4,553,042 | 11/1985 | Batterman | 364/481 |
| 4,621,217 | 11/1986 | Saxe et al. | 324/121 R |
| 4,641,246 | 2/1987 | Halbert et al. | 364/487 |
| 4,642,519 | 2/1987 | Nakatsugawa et al. | 364/487 |
| 4,647,922 | 3/1987 | Saxe | 324/121 R |
| 4,719,416 | 1/1988 | Desautels | 324/121 R |

OTHER PUBLICATIONS

IBM Tech Disc., Apr. 1983 (V25 No. 11B), "Portable Test Tool for High-Speed Signal Analysis", Pechanek, pp. 6240-6243.

Electronics, Mar. 13, 1980 (V53 N6), "On Board Digital Processing Refines Scope Measurements", Garuts et al., pp. 105-114.

Electronics, Sept. 13, 1979 (V52 N19), "When Logic Analyzers Meet Development Systems", Farly, pp. 141-146.

Primary Examiner—P. S. Lall
Assistant Examiner—Kevin J. Teska
Attorney, Agent, or Firm—John P. Dellett; Peter J. Meza

[57] ABSTRACT

An adaptive filtering procedure reduces overshoot which may be present on a waveform having infinite slopes displayed on a digital oscilloscope as a result of interpolation between samples at the location of the infinite slopes. An adaptive filtering procedure identifies sampled points adjacent the infinite slope and moves the points closer to each other to avoid ringing or overshoot on the display. Before modification, a straightness test relative to the waveform before and after a discontinuity and a test for sudden changes in the waveform before and after the discontinuity are performed.

9 Claims, 4 Drawing Sheets

PRE-INTERPOLATION ADAPTIVE FILTER

BACKGROUND OF THE INVENTION

The present invention relates to digital oscilloscope circuitry and particularly to a method and apparatus for more accurately portraying an interpolated signal with fast edges on a digital oscilloscope.

Digital oscilloscopes employing a sin(x)/x interpolator or the like for use on band limited signals have a problem with false ringing appearing on the edges of square-waves and other aliased signals with fast edges. While signals that have dominantly sine wave content will be accurately interpolated, the same interpolation method is not nearly as satisfactory for waveforms with fast rise times or fall times. It is possible, of course, for the oscilloscope to display only the stored samples which are generated according to the digital process without interpolation. However, it would be desirable to provide a substantially continuous signal trace without gaps, especially at magnified sweep speeds, without the overshoots caused by ringing.

SUMMARY OF THE INVENTION

In accordance with the present invention, the interpolation of the sampled input signal is preceded by adaptive filtering wherein fast edges in the input waveform are detected and samples adjacent the fast edge are modified by moving the same closer together in value. Then, as the sampled waveform is interpolated, the characteristic ringing will not appear, or will appear to a much attenuated extent, and the waveform trace presented on the oscilloscope screen will be a more accurate representation of the input signal.

In accordance with a preferred embodiment of the present invention, two tests are performed at all parts of a waveform or portion thereof. The first test is called a straightness test which determines if the waveform is relatively straight prior to and subsequent to a discontinuity. The second test is called a slope test and looks for a sudden change in the waveform slope. If the input waveform, at some location therealong, passes both of these tests, then one or more of the sample points immediately before and immediately after the discontinuity are altered for bringing the same closer together in value, i.e., they are suitably moved toward one another in value.

It is accordingly an object of the present invention to provide an improved digital oscilloscope which more accurately displays input signals.

It is another object of the present invention to provide an improved method and apparatus for portraying fast rise time or fall time signals on a digital oscilloscope.

It is a further object of the present invention to provide improved digital oscilloscope circuitry enabling interpolation of sampled data without excessive ringing on fast edges displayed on the oscilloscope.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

Figure 1:
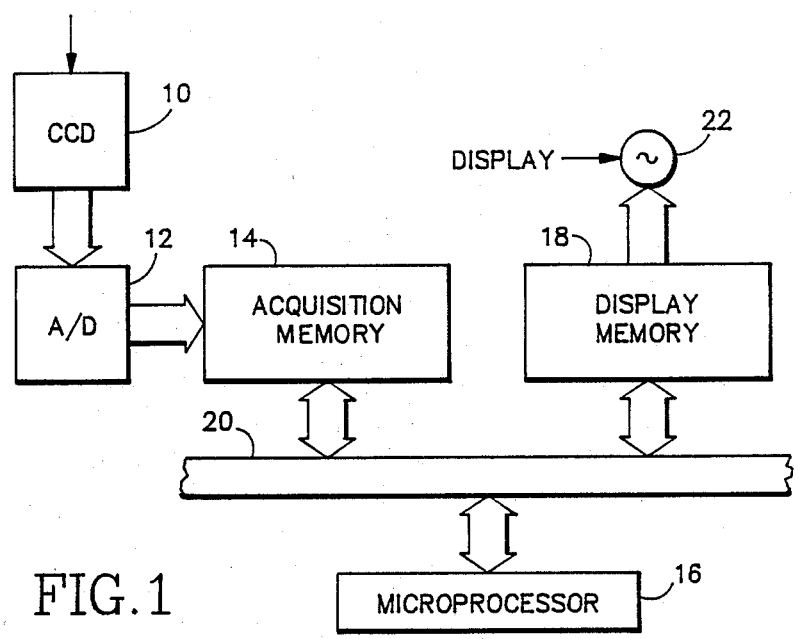
FIG. 1 is a block diagram of a digital oscilloscope system in which the present invention is implemented.

Referring to the drawings and particularly to FIG. 1, illustrating a digital oscilloscope environment in which the present invention is implemented, an input signal from a device under test is received by a sampling device such as an analog delay line or charge coupled device 10 and a plurality of samples therefrom are successively delivered to digitizer or analog-to-digital converter 12 wherein the individual samples are converted to numerical values. The samples are stored in an acquisition memory 14 where they may be accessed and manipulated by means of microprocessor 16 via computer bus 20. The microprocessor 16 suitably comprises a type 6800 manufactured by Motorola, although a more specialized processor can be employed if desired instead of or in conjunction with microprocessor 16. Microprocessor 16 may alter the data stored in acquisition memory 14 preparatory to storing the same as a bit map or the like in display memory 18 where the data is accessed by display means 22 for visual presentation. Inasmuch as the data input is sampled and digitized, the displayed information, if unaltered, will form a multiplicity of dots sequentially located across the display in response to a time base sweep. For relatively fast sweeps, or magnified sweeps, the dots may be visibly separated from one another and it is desirable to connect the same by means of an interpolation method or apparatus. The individual dots can be connected by straight line segments, but this is usually not a very accurate presentation for most waveforms having a high sine wave content. A sin(x)/x interpolation method is well known wherein samples are added in accordance with an average of a number of sequential samples weighted according to a sin(x)/x profile. However, as hereinbefore mentioned, this method of interpolation does not accurately portray fast edges, but tends to produce an overshoot or ringing phenomenon.

According to the present invention, digital values representing successive samples are accessed from acquisition memory 14, tested to ascertain the presence of fast edges having "infinite slope" and the digital sample values are adjusted to minimize the ringing or overshoot as would otherwise result pursuant to the conventional interpolation techniques.

Figure 2:
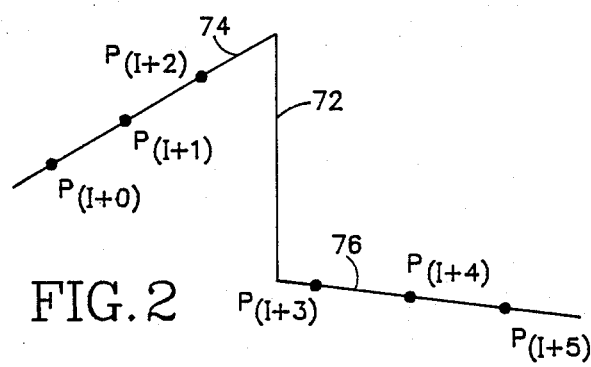
FIG. 2 is a plot of an input signal as may be received by the digital oscilloscope according to the present invention, such signal being sampled at a plurality of points and exhibiting a fast edge between a pair of said points.

Referring to FIG. 2, a waveform is depicted having a sharp fall time at 72. This sharp edge may form part of a square wave, triangular wave or the like as would be characterized by such a sharp edge or discontinuity. The waveforms of the type which it is desired to correct would also be characterized by a relatively straight portion 74 prior to the sharp edge, and a relatively straight portion 76 following the sharp edge. Thus, if the supposed sharp edge 72 is really part of a sine wave of high frequency, "correction" of the same would not be desired. In accordance with the present invention, the "straightness" of portions 74 and 76 of the waveform is tested, as well as the discontinuity 72, against predetermined criteria, to determine if a rise time or a fall time of "infinite slope" is really present. Assuming the waveform passes the tests, one or more of the points adjacent the fast edge 72 are modified to prevent excessive ringing. Although excessive ringing is avoided, the sharp waveform will nonetheless be portrayed accurately.

More specifically, the fast-edge detection tests are performed at all parts of the waveform, or on all parts of the waveform that are of interest after magnification or the like. Referring again to FIG. 2, wherein six sample points $P(I+0)$ through $P(I+5)$ are depicted, these points should pass a straightness test wherein the waveform before and after the discontinuity is shown to comprise nearly straight lines, e.g., by application of the following formula:

if
$$ABS[S(I+0)-S(I+1)]+ABS[S(I+4)-S(I+3)]\leq=ABS[S(I+2)]/D \quad (1)$$

then the test passes where $S(J)=P(J+1)-P(J)$ and $D\simeq 8$.

Figure 3:
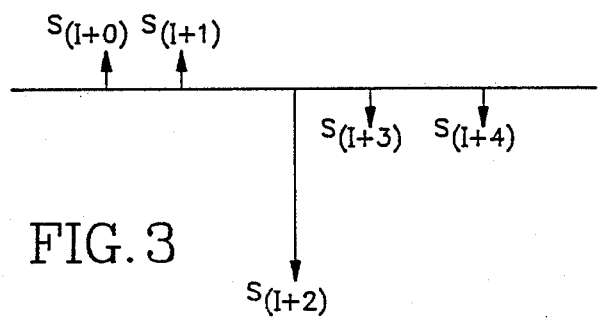
FIG. 3 is a plot of waveform slopes relating to similarly labeled points in FIG. 3, FIGS. 4–6 are explanatory diagrams illustrating criteria utilized in the detection of fast edges, and FIGS. 7–10 comprise a flow chart for a program implementing the present invention.

In this formula, the "S" terms refer to slope. The slopes associated with the various points in FIG. 2 are graphically illustrated in FIG. 3, where the slope $S(I+0)$ represents the slope between points $P(I+0)$ and $P(I+1)$, etc. It is seen the first term in the above expression represents the change in slope of the waveform before the discontinuity, while the second term represents the change in slope after the discontinuity. Thus, if waveform portions 74 and 76 were straight as shown in FIG. 2, the left hand side of the expression would equal zero. Of course, the slopes before and after the discontinuity can vary slightly from absolute straightness, and as a matter of fact if the sum on the left hand side of the expression is no greater than $ABS[S(I+2)]/D$ then the test passes as indicated. The right hand side of the expression represents the slope at the discontinuity divided by the factor D. Consequently, the straightness is measured relative to the size of the discontinuity, or in effect the size of the waveform. The factor D is an adjustment utilized to "fine tune" the sensitivity of the process. The factor D equalling approximately eight has been found to be suitable in a specific embodiment according to the present invention, but the factor D could vary, for example, in a range from three to twenty-five.

The second test in the edge detection procedure is the slope test. This test looks for the sudden change in the waveform slope and a suitable formula is as follows:

if $ABS[S(I+1)-S(I+3)]/2+Epsilon$
$$\leq=ABS[S(I+1)+S(I+3)-2*S(I+2)]/2 \quad (2)$$

then the test passes where $S(J)=P(J+1)-P(J)$ and $Epsilon\simeq 10$.

In this formula, the term on the left hand side represents the excursion of the slopes $S(I+1)$ and $S(I+3)$ from a midpoint therebetween, i.e., it represents variation in slope. The first term on the right hand side of the expression represents the midpoint between slopes $S(I+1)$ and $S(I+3)$, while the last term corresponds to the large slope at the discontinuity. The term Epsilon will be hereinafter discussed.

Figure 4:
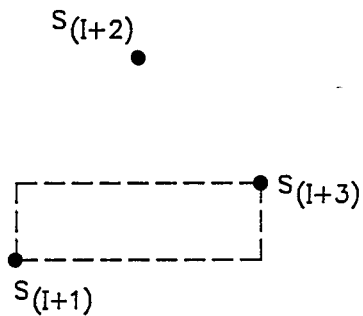
Figure 5:
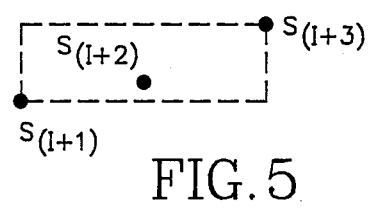
Figure 6:
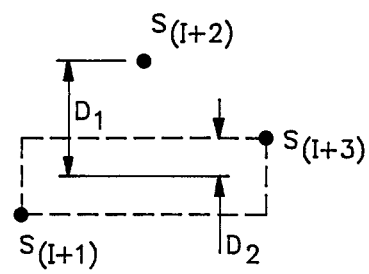
Figure 7:
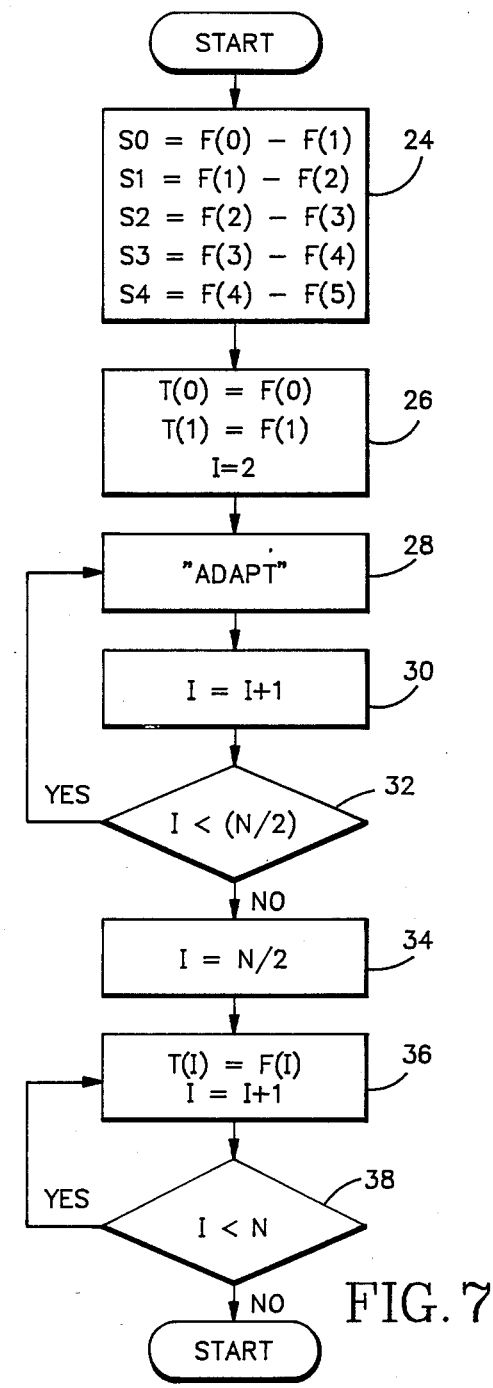

The terms in the above expression will be further explained with the aid of FIGS. 4, 5 and 6. The slopes $S(I+1)$, $S(I+2)$ and $S(I+3)$ which surround and include any "infinite" rise time can be characterized as illustrated in FIG. 4 where $S(I+2)$ lies a large distance from the "region" bounded by $S(I+1)$ and $S(I+3)$. On the other hand, the slopes of a "finite" rise time may be characterized as illustrated in FIG. 5 where $S(I+2)$ lies within the region bound by $S(I+1)$ and $S(I+3)$, or even where $S(I+2)$ lies just outside the region bounded by $S(I+1)$ and $S(I+3)$. A preferred way of determining whether $S(I+2)$ lies near to or farther away from the region bounded by $S(I+1)$ and $S(I+3)$ is to measure the distance, $D_1$, between $S(I+2)$ and the midpoint of the aforementioned region and compare it with the distance, $D_2$, from the midpoint of the region to the edge of that region. The midpoint of the region bounded by $S(I+1)$ and $S(I+3)$ will have the value of $(S1+S3)/2$ where the terms $S(I+1)$ and $S(I+3)$ have been expressed as S1 and S3 respectively for ease of explanation. Likewise, in the following expressions S2 is substituted for $S(I+2)$.

It follows from consideration of FIG. 6 that:

$$D_1=ABS[(S1+S3)/2-S2] \text{ or:}$$

$$D_1=ABS(S1+S3-2*S2)/2 \text{ and:}$$

$$D_2=ABS[(S1+S3)/2-S3] \text{ or:}$$

$$D_2=ABS(S1-S3)/2$$

Therefore, a formula for the slope test can be: if $D_2+Epsilon\leq=D_1$, then the test passes. Substituting the equations for $D_1$ and $D_2$:

if $ABS(S1-S3)/2+Epsilon$
$$\leq=ABS(S1+S3-2*S2)/2 \quad (3)$$

then the test passes.

It will be seen this expression corresponds to formula (2).

Epsilon is a constant which allows S2 to lie a little outside the region bounded by S1 and S3. In a specific embodiment as further describe hereinbelow, any rise or fall in slope less than ten will not be affected by a 10.9375% modification used to alter the waveform. However, any slope (on a square wave or the like) greater than or equal to ten should be modified. As a consequence, it can be shown from the above expressions that an Epsilon of ten is a suitable choice in the aforementioned specific embodiment. If Epsilon is ten, the formula for the slope test can be simplified to:

$$\text{if } ABS(S1-S3)+20\leq=ABS(S1+S3-2*S2) \quad (4)$$

then the test passes.

It is seen this expression corresponds to the formulas (2) and (3) for the slope test.

Epsilon, like the variable D in the formula first given above, may be adjusted to fine tune the sensitivity of the process. Epsilon may be selected to have a value between 3 and 100.

If both the above tests (for straightness and sudden change) pass, then the points before and after the edge 72 in FIG. 2 are moved closer together. That is, point $P(I+2)$ can be moved closer to point $P(I+3)$ or vice versa. Preferably, both points are moved closer to one another. In one embodiment, the following modification formulae were used:

$$Pnew(I+2)=P(I+2)-mod*[P(I+2)-P(I+3)] \quad (5)$$

$$P_{new}(I+3) = P(I+3) + \text{mod} * [P(I+2) - P(I+3)] \quad (6)$$

$$P_{new}(I+2) = P(I+2) + \text{mod} * [P(I+2) - P(I+3)] \quad (7)$$

$$P_{new}(I+3) = P(I+3) - \text{mod} * [P(I+2) - P(I+3)] \quad (8)$$

where formulae (5, 6) above are employed if $P(I+2) > P(I+3)$ and
where formulae (7, 8) above are employed if $P(I+2) < P(I+3)$.

Following the pre-filtering modification as above described, the waveform can be interpolated by conventional sin(x)/x filtering and will produce an overshoot on fast edges controlled by the value of mod above. Thus, mod adjusts the amount of overshoot that occurs on "infinite" rise times. For mod=10.9375%, an over-shoot of about 3.5% will result. However, if mod is set to 0, (i.e., no pre-filtering) an overshoot of about 12% occurs. Therefore it is seen the amount of overshoot is controlled by adjusting mod. The percentage of modification or mod equalling 10.9375% was chosen to provide the approximately 3.5% overshoot, and is is a compromise between a higher percentage with better overshoot reduction but with greater rise time degradation, and a lower percentage with greater rise time integrity but greater overshoot. Specifically, the percentage of overshoot for a "square" wave may be calculated according to the expression:

percentage of overshoot = 12.5 − 0.808594*percentage of modification.

Thus, a 10.9375% modification is seen to yield about a 3.5% overshoot.

In the illustrated embodiment, portions of sample "vectors" are withdrawn from acquisition memory 14 and tested by microprocessor 16 in accordance with the above-described tests. If the series of points passes the two tests for straightness and sudden change of slope, then the central point or points of the group are modified as above described. Thereafter, a further (overlapping) group of points is tested and modified, and the process is continued until all the points have been considered (or half the points if the display is expanded by two, etc.). The points are then interpolated, suitably by conventional sin(x)/x filtering by means of microprocessor 16 before the points (and additional points added by the interpolation) are stored in memory 18 for repetitive display.

FIGS. 7 through 10 contain flow charts that further describe a pre-interpolation filtering method according to the present invention. The input to this program is a vector of data points, called F. The output is also a vector of data points, called T. Vectors F and T both have a length N. In the flow charts, vector indices are 0-based, meaning that they range from 0 to N−1.

The output vector is nearly the same as the input vector, except that "infinite" rise-times in the first half of the vector are modified to reduce ringing when the first half is interpolated. It should be noted that in this specific example the second half (the last N/2 points) of the vector is left unchanged, since these vector elements are to be ignored in an exemplary interpolate-by-2 process.

The program is called ASM2 and is summarized by the following "C"-language subroutine for execution by microprocessor 16:

```
ASM2(F, T, N)
int F[], T[], N;
{
    int I, J, S[5], B;
    /* Initialize the five forward difference slopes. */
    for (I=0; I<5; I++)
        S[I] = F[I] − F[I+1];
    /* The first two points are the unmodified "transient".*/
    for (I=0; I<2; I++)
        T[I] = F[I];
    /* Modify the first half of the vector. */
    for (I=2; I<N/2; I++) {
        if (abs(S[1]−S[3]+20<=abs(S[1]+S[3]−2*S[2]) &&
            abs(S[0]−S[1]+abs(S[3]−S[4])<=abs(S[2])/8) {
            B = (int)(0.109375 * (float)abs(S[2]));
            if (F[I] >= F[I+1])
                B = −B;
            T[I] = F[I] + B;
            T[I+1] = F[I+1] − B;
            for (J=0; J<4; J++)
                S[J] = S[J+1];
            S[4] = F[I+3] − F[I+4];
            I++;
        }
        else
            T[I] = F[I];
        for (J=0; J<4; J++)
            S[J] = S[J+1];
        S[4] = F[I+3] − F[I+4];
    }
    /* Don't modify the second half of the vector. */
    for (I=N/2; I<N; I++)
        T[I] = F[I];
}
```

In a given embodiment, the horizontal trace across the oscilloscope screen consisted of 512 points, and each memory was adapted to store 512 samples. Thus, N=512 for the hereinbefore described subroutine. A stored vector of sample values comprises 512 numbers, and likewise the slopes associated with these points may be considered as comprising a vector of 512 numbers.

Reference is now made more particularly to the flow-chart of FIGS. 7–10, which further describe the program according to the present invention. In block 24 of the FIG. 7 program, the first five slopes of a slope vector are calculated from the input vector of data points. As noted in block 26 of the program, the first two points of the input vector of data points are unmodified and therefore T(0)=F(0) and T(1)=F(1). Also, the index, I, is set to 2. The program then proceeds to block 28 entitled "ADAPT" which is further detailed in FIG. 8.

Figure 8:
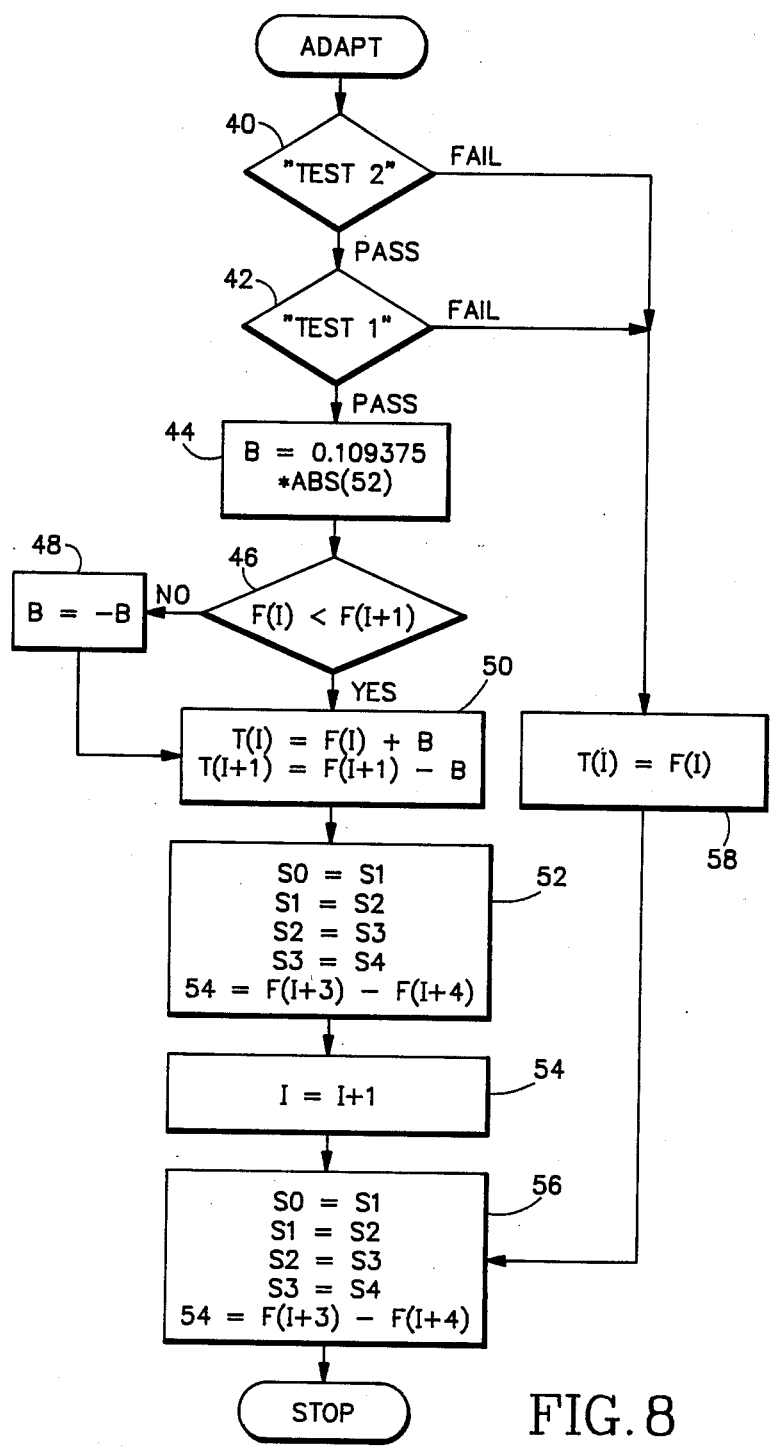
Figure 9:
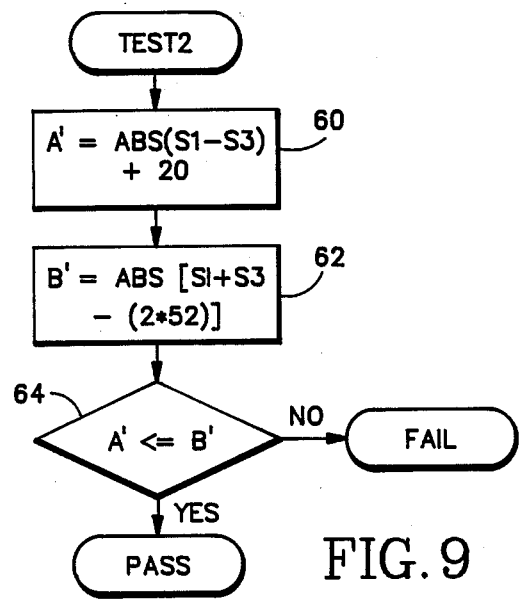

Referring to FIG. 8, the procedure suitably first enters decision block 40 involving test number 2 as hereinbefore defined and as further detailed in FIG. 9. If this test passes, program flow proceeds to decision block 42 where test number 1 as hereinbefore defined and as detailed in FIG. 10 takes place. If both tests pass, block 44 is entered. However, if either test fails, indicating no modification of the input vector is desired, then according to block 58, T(I) is made equal to F(I), while in block 56 the slope values are "shuffled" in order to next consider the next five slopes associated with the next five points on the waveform. Now the first four of the new points overlap the last four previously considered. The program then returns to the program of FIG. 7.

However, if both tests pass according to the procedure of FIG. 8, the specified multiplication is accomplished in block 44 wherein B, the amount of modification for the "infinite" slope encountered, is made equal to 0.109375*ABS(S2) as hereinbefore suggested wherein "mod" is set to 10.9375%. Of course it is realized this figure is specific to a particular embodiment.

In the following decision block, 46, the determination is made whether the point under consideration is greater or less than the following point, i.e., whether the discontinuity is upward or downward. If upward, block 50 is entered whereby a modification B is added to the point just previous to the discontinuity, while in this embodiment the following point also has the modification value subtracted therefrom. If, on the other hand, a downward transition occurred, the sign of B is changed according to block 48 so the reverse modification is accomplished. Block 52 indicates a shift to the right along the waveform vector and in block 54 the index, I, is set equal to I+1. In block 56 a further shift to the right occurs since the modification involved two points in this embodiment. The program then returns to FIG. 7 where I is set equal to I+1 in block 30 and decision block 32 is entered to determine whether I is less than N/2 in order to ascertain whether the first 256 points have been traversed. If they have not, the procedure returns to block 28 so the next set of slopes can be tested. If 256 points have been tested in accordance with the example procedure, i.e., if I equals N/2 in block 34, then the remaining points are merely copied from the input vector to the output vector in accordance with the sequence of blocks 36 and 38. In the described embodiment it is again noted that only the first N/2 points are considered for modification since the display has been expanded twofold.

Referring to FIG. 9, test 2 is detailed and is in accordance with the simplified formula (4), it being understood the factor Epsilon has been set to ten. In block 60, the first term on the left hand side of expression (4) is calculated, while in accordance with block 62, the right hand term is calculated. The pass-fail decision is made via decision block 64 in accordance with whether A, is greater than or less than B'.

Figure 10:
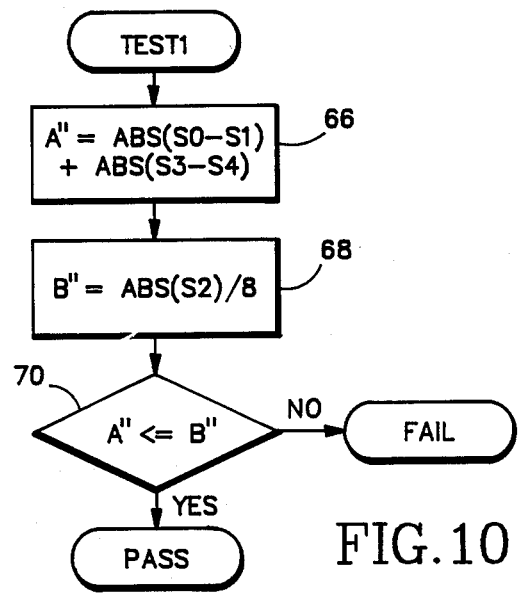

Similarly, according to the procedure flow-charted in FIG. 10, block 66 provides a calculation corresponding to the left hand summation in formula (1) hereinabove, while block 68 supplies the right hand term. In decision block 70, the pass-fail decision is made.

While plural embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. In a digital oscilloscope having means for sampling an input signal and providing sample related values for presentation by graphic display, a method of altering said samples comprising:
    detecting a series of said samples that correspond to a rapid change in the value of said input signal,
    altering the values of ones of said samples to reduce said rapid change, and
    interpolating between said series of altered samples.

2. The method according to claim 1 wherein said detection of rapid change includes detecting at least a predetermined difference between the value of a pair of successive samples.

3. The method according to claim 2 wherein said detection of rapid change further includes detecting relatively constant values of successive samples both before and after detection of said predetermined difference.

4. The method according to claim 3 wherein said detection of relatively constant values measures the absence of change exceeding a predetermined limit.

5. In a digital oscilloscope having means for sampling an input signal and providing sample related values for presentation by graphic display, a method of altering said samples comprising:
    determining the slope of said signal according to changes in value between successive samples,
    detecting an array of samples having a change in slope as between successive pairs of samples, which change is less than a predetermined standard, followed by a large slope as represented by a large change in value between a further pair of samples, which change is greater than a second predetermined standard, followed by a change in slope between further successive pairs of samples, which is less than a predetermined standard, and
    in response to said detection altering the value of at least one of said further pair of samples to bring it closer to the remaining sample of said further pair of samples.

6. The method according to claim 5 including altering the values of both of said further pair of samples to bring them closer to one another.

7. The method according to claim 5 wherein detection of said large slope is made in comparison to the range of slope of said signal substantially immediately before and substantially immediately after said large slope.

8. The method according to claim 5 wherein said changes in slope between successive pairs of samples are detected in comparison to said large slope.

9. A digital oscilloscope circuit having means for sampling an input signal and providing sample related variables for presentation on graphic display means, comprising:
    input means for storing a plurality of time related samples of an input signal,
    means for detecting an array of stored samples having rapid rise or fall times between a pair of said array of stored samples,
    means for altering at least one of said pair of samples for bringing its value closer to the other of said pair of samples and
    interpolation means for receiving said altered samples and producing interpolation between ones of said altered samples according to a predetermined approximation.

* * * * *